United States Patent
Kong et al.

(10) Patent No.: US 10,171,124 B2
(45) Date of Patent: Jan. 1, 2019

(54) LOW NOISE AMPLIFIER ARBITER FOR LICENSE ASSISTED ACCESS SYSTEMS

(71) Applicant: Apple Inc., Cupertino, CA (US)

(72) Inventors: Daniel C. Kong, Mountain View, CA (US); Ali Ghoreishi, Cupertino, CA (US); William J. Noellert, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/655,540

(22) Filed: Jul. 20, 2017

(65) Prior Publication Data

US 2018/0331709 A1 Nov. 15, 2018

Related U.S. Application Data

(60) Provisional application No. 62/505,364, filed on May 12, 2017.

(51) Int. Cl.
| | |
|---|---|
| *H04L 5/16* | (2006.01) |
| *H04B 1/40* | (2015.01) |
| *H03G 3/30* | (2006.01) |
| *H03F 3/19* | (2006.01) |
| *H04W 84/12* | (2009.01) |
| *H04W 84/04* | (2009.01) |
| *H04B 7/0413* | (2017.01) |

(52) U.S. Cl.
CPC .............. *H04B 1/40* (2013.01); *H03F 3/19* (2013.01); *H03G 3/3042* (2013.01); *H03F 2200/294* (2013.01); *H03F 2200/451* (2013.01); *H04B 7/0413* (2013.01); *H04W 84/042* (2013.01); *H04W 84/12* (2013.01)

(58) Field of Classification Search
CPC .... H04B 1/40; H04B 3/23; H04B 1/00; H04L 27/2601; H04W 28/08
USPC ................... 375/219; 370/328, 329
See application file for complete search history.

(56) References Cited

U.S. PATENT DOCUMENTS

| | | | |
|---|---|---|---|
| 9,294,926 B2* | 3/2016 | Pragada | H04W 16/14 |
| 2016/0219589 A1* | 7/2016 | Khawer | H04W 72/0453 |
| 2018/0035300 A1* | 2/2018 | Noellert | H04W 16/14 |

* cited by examiner

*Primary Examiner* — Khai Tran
(74) *Attorney, Agent, or Firm* — Fletcher Yoder PC

(57) ABSTRACT

Methods and devices useful in concurrently receiving and supporting Wireless Fidelity (Wi-Fi) and Long Term Evolution Licensed Assisted Access (LTE-LAA) wireless data signals are provided. By way of example, an electronic device includes a front end module having an arbiter device that controls one or more gain stages to selectively amplify the Wi-Fi and LTE-LAA signals.

19 Claims, 10 Drawing Sheets

| State | Mode | WLAN Mode Request | LAA Mode Request | a1 Gain (dB) | a3 Gain (dB) | WLAN Module Gain (dB) | LAA Module Gain (dB) | SW_1 | SW_2 | VDD MUX Output |
|---|---|---|---|---|---|---|---|---|---|---|
| 0 | FEM Shut Down | WLAN Shutdown | | OFF | OFF | OFF | OFF | High Iso | High Iso | OFF |
| 1 | WLAN Tx | WLAN Tx mode | | L | OFF | L | OFF | 1-3 enabled | 1-3 enabled | ON |
| 2 | Single_LAA_HG | OFF | LAA_HG | H | H | OFF | H | 1-2 enabled | 1-2 enabled | ON |
| 3 | Single_LAA_MG | OFF | LAA_MG | M | H | OFF | M | 1-2 enabled | 1-2 enabled | ON |
| 4 | Single_LAA_LG | OFF | LAA_LG | L | H | OFF | L | 1-2 enabled | 1-2 enabled | ON |
| 5 | Single_WLAN_HG | WLAN_HG | OFF | H | OFF | H | OFF | 1-2 enabled | 1-2 enabled | ON |
| 6 | Single_WLAN_MG | WLAN_MG | OFF | M | OFF | M | OFF | 1-2 enabled | 1-2 enabled | ON |
| 7 | Single_WLAN_LG | WLAN_LG | OFF | L | OFF | L | OFF | 1-2 enabled | 1-2 enabled | ON |
| 8 | Dual Rx_HG_HG | WLAN_HG | LAA_HG | H | H | H | H | 1-2 enabled | 1-2 enabled | ON |
| 9 | Dual Rx_HG_MG | WLAN_HG | LAA_MG | H | M | H | M | 1-2 enabled | 1-2 enabled | ON |
| 10 | Dual Rx_HG_LG | WLAN_HG | LAA_LG | H | L | H | L | 1-2 enabled | 1-2 enabled | ON |
| 11 | Dual Rx_MG_MG | WLAN_MG | LAA_MG | M | H | M | M | 1-2 enabled | 1-2 enabled | ON |
| 12 | Dual Rx_MG_LG | WLAN_MG | LAA_LG | M | M | M | L | 1-2 enabled | 1-2 enabled | ON |
| 13 | Dual Rx_LG_LG | WLAN_LG | LAA_LG | L | H | L | L | 1-2 enabled | 1-2 enabled | ON |

*FIG. 10*

| STATE (Dev1) | STATE (Dev3) | STATE INPUT NAME | RFFE VIO | WLAN MODE REQUEST | LAA MODE REQUEST | MODE OUTPUT | State Output | a1 Gain (dB) | a2 Gain (dB) | a3 Gain (dB) | WLAN Module Gain (dB) | LAA Module Gain (dB) | SW_1 | VDD MUX Output |
|---|---|---|---|---|---|---|---|---|---|---|---|---|---|---|
| 0 | 0 | Shut Down | 1 | WLAN OFF | LAA OFF | Shut Down | 0 | OFF | | OFF | OFF | OFF | High Iso | OFF |
| 0 | 0 | Shut Down | 0 | WLAN OFF | UNDEFINED | Shut Down | 0 | OFF | | OFF | OFF | OFF | High Iso | OFF |
| 1 | | WLAN Tx | 1 | WLAN Tx | LAA OFF | WLAN Tx + LAA High Atten | 1 | L | L | L | L | L | 1-3 enabled | ON |
| 1 | | WLAN Tx | 0 | WLAN Tx | UNDEFINED | WLAN Tx + LAA High Atten | 1 | L | L | L | L | L | 1-3 enabled | ON |
| 1 | | WLAN Tx | 1 | WLAN Tx | LLA HG | WLAN Tx + LAA High Atten | 1 | L | L | L | L | L | 1-3 enabled | ON |
| 1 | | WLAN Tx | 1 | WLAN Tx | LAA MG | WLAN Tx + LAA High Atten | 1 | L | L | L | L | L | 1-3 enabled | ON |
| 1 | | WLAN Tx | 1 | WLAN Tx | LAA LG | WLAN Tx + LAA High Atten | 1 | L | L | L | L | L | 1-3 enabled | ON |
| 2 | 3 | Single_LAA_HG | 1 | WLAN OFF | LAA HG | LAA HG | 3 | H | L | H | M | H | 1-2 enabled | ON |
| 3 | 4 | Single_LAA_MG | 1 | WLAN OFF | LAA MG | LAA MG | 4 | M | L | H | L | M | 1-2 enabled | ON |
| 4 | 5 | Single_LAA_LG | 1 | WLAN OFF | LAA LG | LAA LG | 5 | L | L | L | L | L | 1-2 enabled | ON |
| 5 | 6 | Single_WLAN_HG | 1 | WLAN HG | LAA OFF | WLAN HG | 6 | H | H | L | H | M | 1-2 enabled | ON |
| 7 | | Single_WLAN_Bypass | 1 | WLAN Bypass | LAA OFF | WLAN Bypass | 7 | L | H | H | M | L | 1-2 enabled | ON |
| 8 | | Single_WLAN_LG | 1 | WLAN LG | LAA OFF | WLAN LG | 8 | H | L | H | L | M | 1-2 enabled | ON |
| | 6 | Single_WLAN_HG | 0 | WLAN HG | UNDEFINED | WLAN HG | 6 | H | H | L | H | M | 1-2 enabled | ON |
| | 7 | Single_WLAN_Bypass | 0 | WLAN Bypass | UNDEFINED | WLAN Bypass | 7 | L | H | L | M | L | 1-2 enabled | ON |
| | 8 | Single_WLAN_LG | 0 | WLAN LG | UNDEFINED | WLAN LG | 8 | H | L | L | M | M | 1-2 enabled | ON |
| 8 | 9 | Dual Rx_HG_HG | 1 | WLAN HG | LAA HG | WLAN HG + LAA HG | 9 | H | H | L | H | H | 1-2 enabled | ON |
| 9 | 10 | Dual Rx_HG_MG | 1 | WLAN HG | LAA MG | WLAN HG + LAA MG (LL) | 10 | H | H | M | H | M | 1-2 enabled | ON |
| 10 | 11 | Dual Rx_HG_LG | 1 | WLAN HG | LAA LG | WLAN HG + LAA LG (LL) | 11 | H | L | L | H | M | 1-2 enabled | ON |
| 11 | 14 | Dual Rx_Bypass_HG | 1 | WLAN Bypass | LAA HG | WLAN Bypass + LAA HG | 14 | L | H | H | M | H | 1-2 enabled | ON |
| 15 | 14 | Dual Rx_Bypass_MG | 1 | WLAN Bypass | LAA MG | WLAN Bypass + LAA MG | 14 | L | H | H | M | M | 1-2 enabled | ON |
| 16 | 14 | Dual Rx_Bypass_LG | 1 | WLAN Bypass | LAA LG | WLAN Bypass + LAA LG | 14 | L | L | L | M | M | 1-2 enabled | ON |
| 13 | 15 | Dual Rx_LG_HG | 1 | WLAN HG | LAA HG | WLAN LG + LAA HG | 15 | H | H | L | M | H | 1-2 enabled | ON |
| | 16 | Dual Rx_LG_MG | 1 | WLAN HG | LAA MG | WLAN LG + LAA MG (LL) | 16 | H | L | M | M | M | 1-2 enabled | ON |
| | 17 | Dual Rx_LG_LG | 1 | WLAN HG | LAA LG | WLAN LG + LAA LG (LL) | 17 | H | L | L | M | M | 1-2 enabled | ON |
| | 18 | Dual Rx_Idle_OFF | 1 | WLAN Idle | LAA OFF | WLAN Bypass | 7 | L | H | L | M | L | 1-2 enabled | ON |
| | 19 | Dual Rx_Idle_HG | 1 | WLAN Idle | LAA HG | LAA HG | 3 | H | L | H | M | H | 1-2 enabled | ON |
| | 20 | Dual Rx_Idle_MG | 1 | WLAN Idle | LAA MG | LAA MG | 4 | M | L | M | M | M | 1-2 enabled | ON |
| | 21 | Dual Rx_Idle_LG | 1 | WLAN Idle | LAA LG | LAA LG | 5 | L | L | H | L | L | 1-2 enabled | ON |

*FIG. 12*

LOW NOISE AMPLIFIER ARBITER FOR LICENSE ASSISTED ACCESS SYSTEMS

CROSS-REFERENCE TO RELATED APPLICATIONS

This application is a Non-Provisional Application claiming priority to U.S. Provisional Patent Application No. 62/505,364, entitled "LOW NOISE AMPLIFIER ARBITER FOR LICENSE ASSISTED ACCESS SYSTEMS," filed May 12, 2017, which is herein incorporated in its entirety for all purposes.

BACKGROUND

The present disclosure relates generally to cellular and wireless devices, and more particularly, to cellular and wireless devices utilized to support Long Term Evolution License Assisted Access (LTE-LAA) systems.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and receivers, or when coupled together as part of a single unit, transceivers, are commonly included in various electronic devices, and particularly, portable electronic devices such as, for example, phones (e.g., mobile and cellular phones, cordless phones, personal assistance devices), computers (e.g., laptops, tablet computers), internet connectivity routers (e.g., Wi-Fi routers or modems), radios, televisions, or any of various other stationary or handheld devices. Certain types of transceivers, known as wireless transceivers, may be used to generate and receive wireless signals to be transmitted and/or received by way of an antenna coupled to the transceiver. Specifically, the wireless transceiver is generally used to wirelessly communicate data over a network channel or other medium (e.g., air) to and from one or more external wireless devices.

Long Term Evolution (LTE) is a standard for wireless data communication or the network through which the data is communicated, and may involve the use of certain LTE transceivers within electronic devices. An LTE standard network may provide the advantages of a high data rate and relatively low latency and delay. An LTE standard network may also support various carrier bandwidths that may range, for example, from 1.4 megahertz (MHz) up to 2.4 gigahertz (GHz) in some cases. Most generally, the carrier bandwidth that is utilized by an LTE transceiver of an electronic device may be based upon the frequency band and the amount of frequency spectrum available from an LTE network provider or within a given LTE coverage region. With the exponentially increasing global demand for mobile data bandwidth, cellular carriers and operators may look to make use of the industrial, scientific, and medical (ISM) frequency spectrum (e.g., unlicensed frequency spectrum) to offload the sometimes overly congested licensed LTE networks. As such, it may be useful to provide more advanced and improved LTE transceivers and devices to support the use of unlicensed frequency bands.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Various embodiments of the present disclosure may be useful in concurrently receiving and supporting Wireless Fidelity (Wi-Fi) and Long Term Evolution Licensed Assisted Access (LTE-LAA) wireless data signals. By way of example, an electronic device includes a network interface configured to allow the electronic device to communicate over one or more channels of a wireless network, and a transceiver configured to transmit data and to receive data over the one or more channels. The transceiver is configured to receive licensed cellular signals and unlicensed cellular signals over the one or more channels.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 10 is a truth table describing the function of the LNA arbiter device of FIG. 9;

FIG. 12 is a truth table describing the function of the LNA arbiter device of FIG. 11.

DETAILED DESCRIPTION

Figure 1:
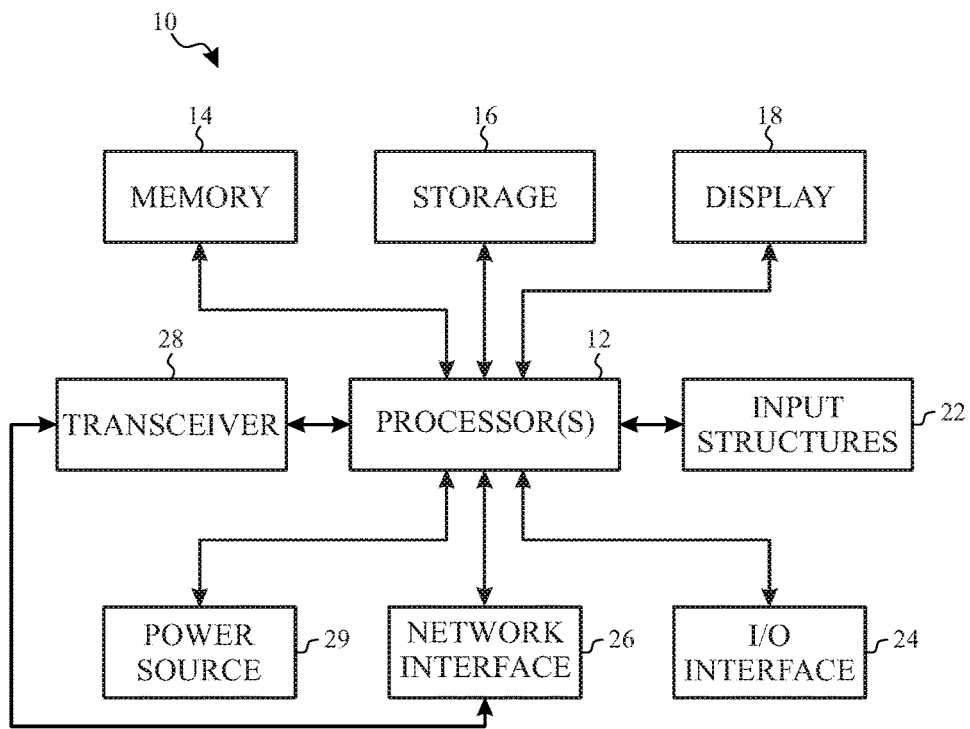
FIG. 1 is a schematic block diagram of an electronic device including a transceiver, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Embodiments of the present disclosure generally relate to a transceiver of an electronic device useful in concurrently receiving and supporting Wireless Fidelity (Wi-Fi) and Long Term Evolution License Assisted Access (LTE-LAA) wireless data signals to increase data throughput and data processing speeds. In certain embodiments, the transceiver may include radio frequency (RF) front end circuitry (e.g., Wi-Fi and/or LTE RF circuitry) that may be used, for example, to support the Wi-Fi and LTE wireless communication standards. Indeed, in certain embodiments, the RF circuitry of the transceiver may, in addition to allowing the electronic device to support Wi-Fi and LTE wireless applications, be utilized to process and support 5 gigahertz (GHz) (e.g., frequency band of approximately 5.1 GHz to 5.8 GHz) LTE license assisted access (LTE-LAA) wireless communication applications.

For example, in certain embodiments, the RF circuitry may allow the transceiver of the electronic device to utilize the Wi-Fi signal processing circuitry (e.g., 5 GHz signal processing circuitry) of the electronic device to additionally process LTE-LAA wireless signals in order to conserve area, power, and cost of the transceiver, and, by extension, the electronic device 10. Indeed, in some embodiments, the RF circuitry may allow for concurrent reception of both Wi-Fi and LTE-LAA wireless signals (e.g., 5 GHz band cellular signals) by splitting incoming signals (e.g., received signals) during the time, or just after the incoming signals are amplified by an low noise amplifier (LNA) of the RF circuitry. For example, in certain embodiments, the RF circuitry may arbitrate between LTE-LAA and Wi-Fi wireless signals to determine when to turn "ON" one or more LNAs of the RF circuitry to amplify either the LTE-LAA signals or the Wi-Fi wireless signals.

In particular, the present embodiments include LNA arbiter designs that can provide multi-stage gain control for both LTE-LAA and Wi-Fi signals, including simultaneous and independent control. Each signal path may include one or more LNAs with variable gain control, as well as one or more gain adjustment devices also with variable gain control. As incoming signals are received by an appropriate cellular modem, the modem provides information related to the characteristics of the incoming signals to the LNA arbiter. In response, the LNA arbiter provides control signals to the LNAs and gain adjustment devices to set gain levels appropriate for the incoming signals.

Thus, in accordance with the present embodiments, the RF circuitry of the transceiver may allow the electronic device to be utilized to allow cellular carriers and operators to utilize the 5 GHz unlicensed frequency spectrum to offload congested licensed LTE networks, and thus increase data throughput and data processing speeds. Furthermore, the RF circuitry may allow for concurrent reception of both Wi-Fi and LTE-LAA wireless signals while simultaneously allowing, for example, Wi-Fi and LTE operation of the electronic device to function asynchronously. As used herein, licensed cellular signals refer to cellular signals in a licensed frequency band and unlicensed cellular signals refer to cellular signals in an unlicensed frequency band. As further used herein, licensed antenna refers to an antenna receiving cellular signals in a licensed frequency band and unlicensed antenna refers to an antenna receiving cellular signals in an unlicensed frequency band. Further, as used herein, licensed path refers to a signal path for cellular signals in a licensed frequency band and unlicensed path refers to a signal path for cellular signals in an unlicensed frequency band.

With the foregoing in mind, a general description of suitable electronic devices that may employ a transceiver useful in concurrently receiving and supporting Wi-Fi and LTE-LAA wireless data signals will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, a transceiver 28, and a power source 29. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
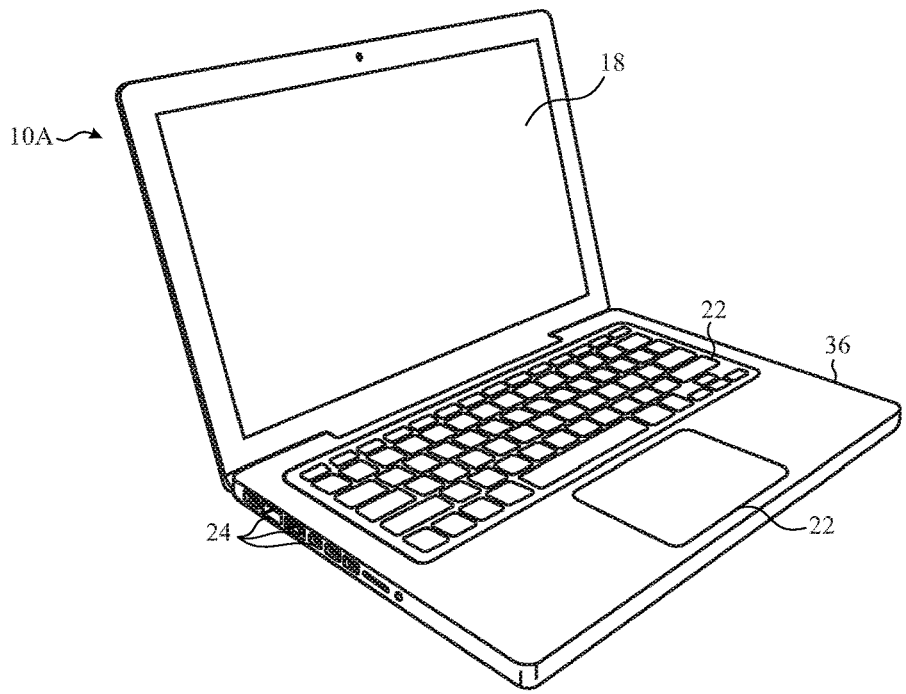
FIG. 2 is a perspective view of a notebook computer representing an embodiment of the electronic device of FIG. 1.
Figure 3:
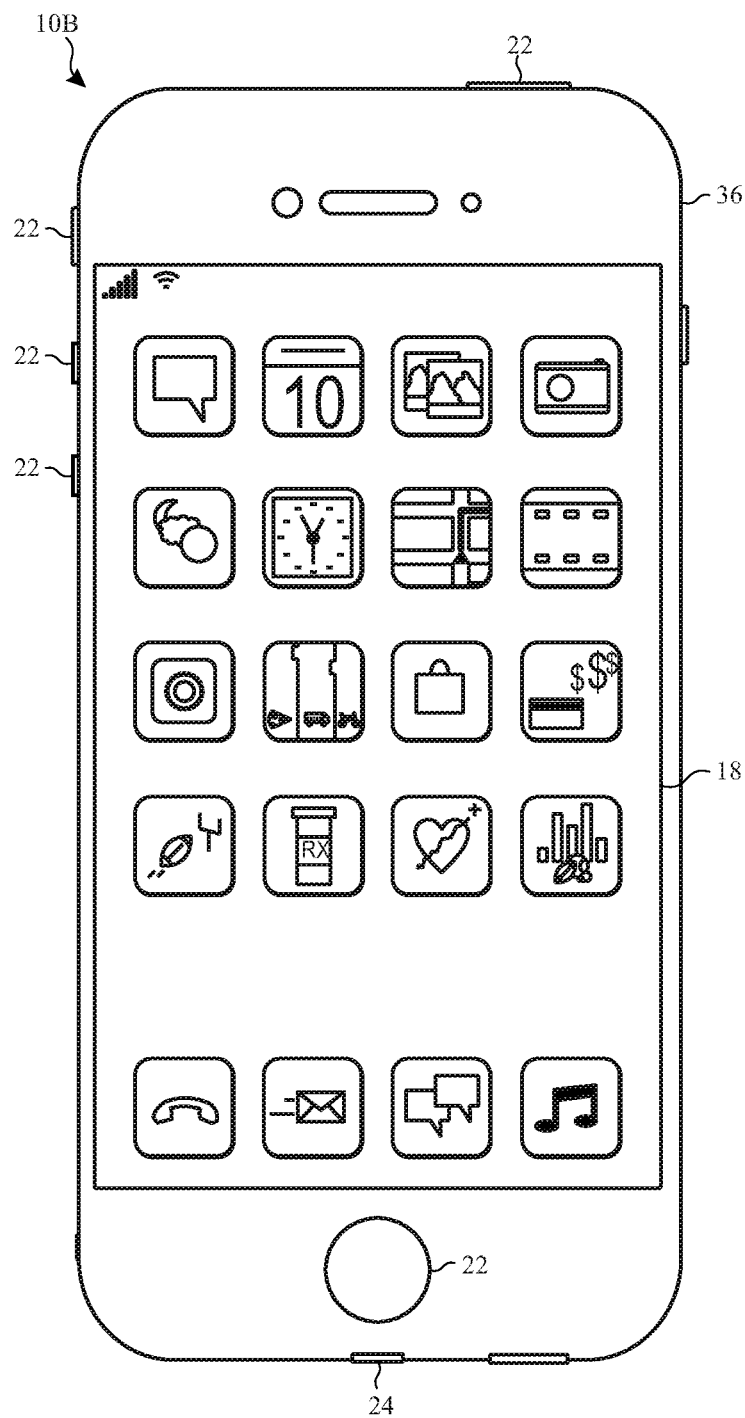
FIG. 3 is a front view of a hand-held device representing another embodiment of the electronic device of FIG. 1.
Figure 4:
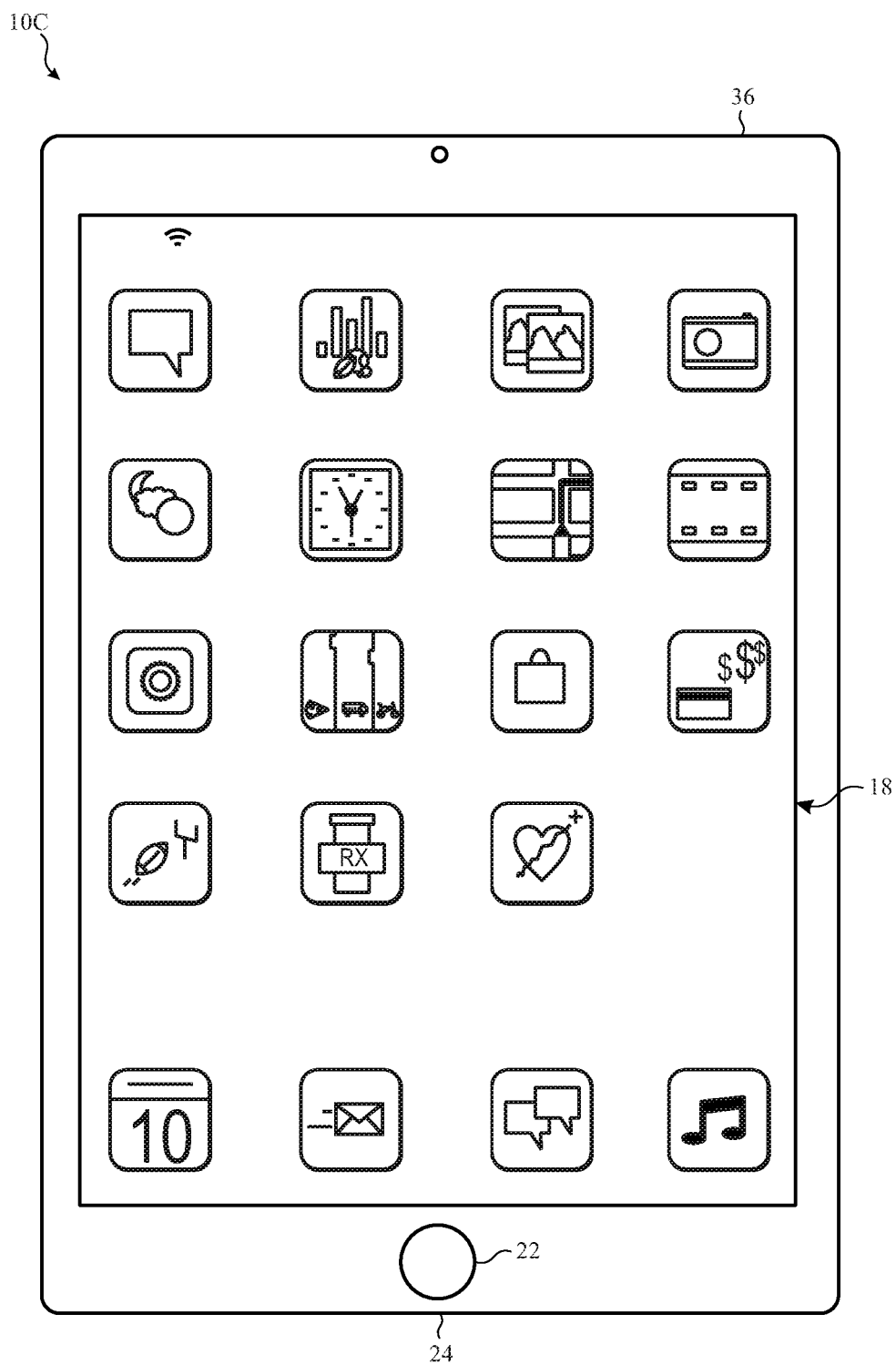
FIG. 4 is a front view of another hand-held device representing another embodiment of the electronic device of FIG. 1.
Figure 5:
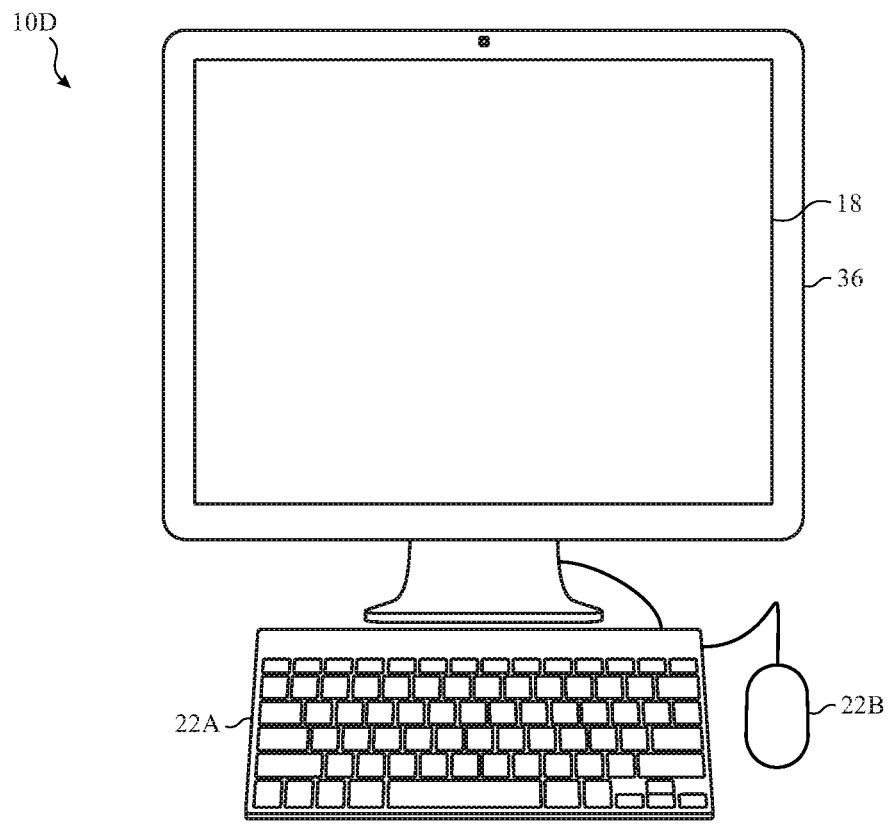
FIG. 5 is a front view of a desktop computer representing another embodiment of the electronic device of FIG. 1.
Figure 6:
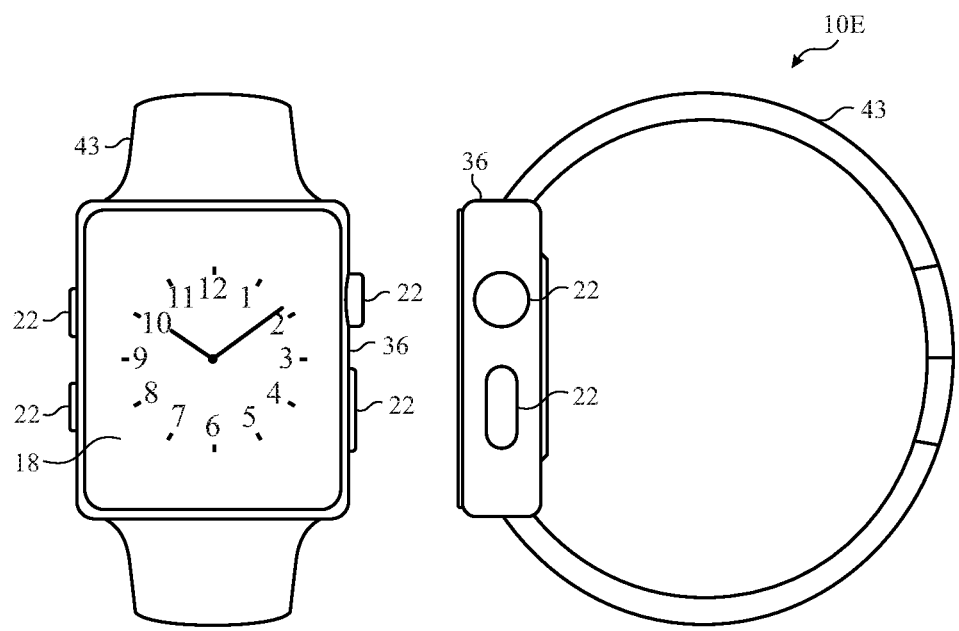
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry the may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. For example, the transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE and LTE-LAA cellular networks), WiMAX networks, mobile WiMAX networks, ADSL and VDSL networks, DVB-T and DVB-H networks, UWB networks, and so forth. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

In certain embodiments, as previously noted above, each embodiment (e.g., notebook computer 10A, handheld device 10B, handheld device 10C, computer 10D, and wearable electronic device 10E) of the electronic device 10 may include a transceiver 28, which may include an in-phase/quadrature (I/Q) transceiver (e.g., WLAN I/Q transceiver). Indeed, as will be further appreciated, the I/Q transceiver may include a transmitter path and receiver path, and may be used to reduce or substantially eliminate IQMM and/or LO leakage components that may otherwise become apparent in an RF transmission signal of the transceiver.

Figure 7:
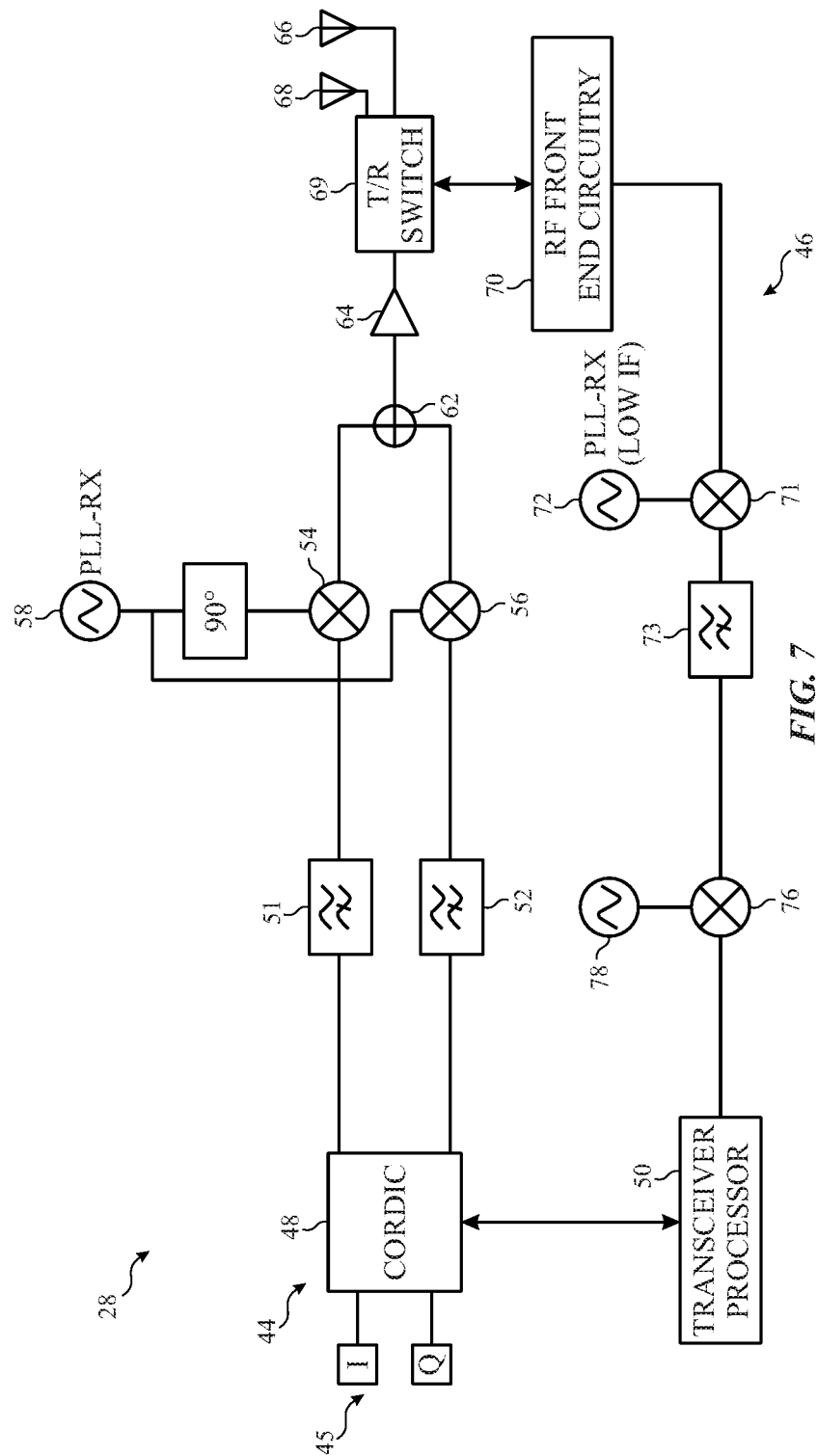
FIG. 7 is a schematic diagram of the transceiver included within the electronic device of FIG. 1, in accordance with an embodiment.

With the foregoing in mind, FIG. 7 depicts a schematic diagram of the transceiver 28. As illustrated, the transceiver 28 may include a transmitter 44 (e.g., transmitter path) and a receiver 46 (e.g., receiver path) coupled as part of a single unit. As depicted, the transmitter 44 may receive a signal 45 that may be initially modulated via a coordinate rotation digital computer (CORDIC) 48 that may, in some embodiments, be used to process individual Cartesian represented data symbols (e.g., OFDM symbols) into polar amplitude and phase components. In some embodiments, the CORDIC 48 may include a digital signal processor (DSP) or other processor architecture that may be used to process the incoming signal 45. In some embodiments, the CORDIC 48 may also communicate with a transceiver processor 50 (e.g., on-board processor) that may be used to process transmitted and/or received WLAN (e.g., Wi-Fi) and/or cellular (e.g., LTE) signals.

In certain embodiments, during operation, the transmitter 44 may receive a Cartesian coordinate represented signal 45, which may include, for example, data symbols encoded according to orthogonal I/Q vectors. Thus, when an I/Q signal is converted into an electromagnetic wave (e.g., radio frequency (RF) signal, microwave signal, millimeter wave signal), the conversion is generally linear as the I/Q may be frequency band-limited. The I/Q signals 45 may be then respectively passed to high pass filters (HPFs) 51 and 52, which may be provided to pass the higher frequency components of the I/Q signals 45 and filter out the lower frequency components. As further illustrated, the I/Q signals 45 may be then respectively passed to mixers 54 and 56, which may be used to mix (e.g., multiply or upconvert) the in-phase (I) component and the quadrature (Q) component of the I/Q signals 45.

In certain embodiments, as further illustrated in FIG. 7, a transmitter phase lock loop (PLL-TX) or oscillator 58 may be provided to generate 90° out of phase oscillation signals by which to mix the orthogonal in-phase (I) component and the quadrature (Q) component to generate a carrier frequency and/or radio frequency (RF) signal. The in-phase (I) component and the quadrature (Q) component signals may be then recombined via a summer 62, and then passed to a power amplifier (PA) 64 to amplify the summed signal, to generate an electromagnetic signal (e.g., RF signal, microwave signal, millimeter wave signal) to be provided to antennas 66 and 68 (e.g., multiple input multiple output [MIMO] antennas) for transmission. In some embodiments, the antennas 66 and 68 may be included on the same integrated chip as the transceiver 28 architecture. However, in other embodiments, the antennas 66 and 68 may be fabricated as part of a separate chip and/or circuitry that may be coupled to the other circuitry components (e.g., PA 64) of the transceiver 28.

In certain embodiments, as previously noted, the transmitter 44 may be coupled together with the receiver 46. Thus, as illustrated, the transceiver 28 may further include a transmitter/receiver (T/R) switch 69 or other circulator device, which may be useful in routing signals to be transmitted to the antennas 66 and 68 and routing signals received via the antennas 66 and 68 to the receiver 46 (e.g., receiver path). In certain embodiments, the transceiver processor 50 in conjunction with an RF front end circuitry 70 (e.g., Wi-Fi and/or LTE RF circuitry) of the transceiver 28 may be used, for example, to support the Wi-Fi and LTE wireless communication standards. Indeed, in certain embodiments, as will be further appreciated, the transceiver processor 50 and the RF front end circuitry 70 may, in addition to allowing the electronic device 10 to support Wi-Fi and LTE wireless applications, be utilized to process and support 5 gigahertz (GHz) (e.g., frequency band of approximately 5.1 GHz to 5.8 GHz) LTE license assisted access (LTE-LAA) wireless communication applications.

For example, in certain embodiments, the RF front end circuitry 70 may allow the transceiver 28 to utilize the dedicated Wi-Fi signal processing circuitry (e.g., 5 GHz signal processing circuitry) to additionally process LTE-LAA wireless signals in order to conserve area, power, and cost of the transceiver 28, and, by extension, the electronic device 10. Indeed, as will be further appreciated, the RF front end circuitry 70 may allow for concurrent reception of both Wi-Fi and LTE-LAA wireless signals (e.g., 5 GHz band cellular signals) by splitting incoming signals (e.g., received signals) during the time, or just after the incoming signals are amplified by a low noise amplifier (LNA) of the RF front end circuitry 70 and/or of the receiver 46. For example, in certain embodiments, the RF front end circuitry 70 may arbitrate between LTE-LAA and Wi-Fi wireless signals to determine when to turn "ON" (e.g., activate) or "OFF" (e.g., deactivate) one or more LNAs of the RF circuitry 70. In some embodiments, as will be further appreciated with respect to FIG. 8, the cellular RF circuitry (e.g., LTE RF circuitry) may signal the RF front end circuitry 70 through one or more relays of the RF front end circuitry 70 such that the LTE-LAA wireless signals are received and processed in a similar manner as the Wi-Fi wireless signals.

As further depicted in FIG. 7, during operation, the receiver 46 may receive RF signals (e.g., LTE and/or Wi-Fi signals) detected by the antennas 66 and 68. For example, as illustrated in FIG. 7, received signals may be received by the receiver 46. The received signals may be then passed to a mixer 71 (e.g., downconverter) to mix (e.g., multiply) the received signals with an IF signal (e.g., 10-20 megahertz (MHz) signal) provided by a receiver phase lock loop (PLL-RX) or oscillator 72.

In certain embodiments, as further illustrated in FIG. 7, the IF signal may be then passed to a low-pass filter 73, and then mixer 76 that may be used to mix (e.g., downconvert a second time) with a lower IF signal generated by an oscillator 78 (e.g., numerically controlled oscillator). The oscillator 78 may include any oscillator device that may be useful in generating an analog or discrete-time and/or frequency domain (e.g., digital domain) representation of a carrier frequency signal. The IF signal may be then passed to the transceiver processor 50 to be processed and analyzed.

Figure 8:
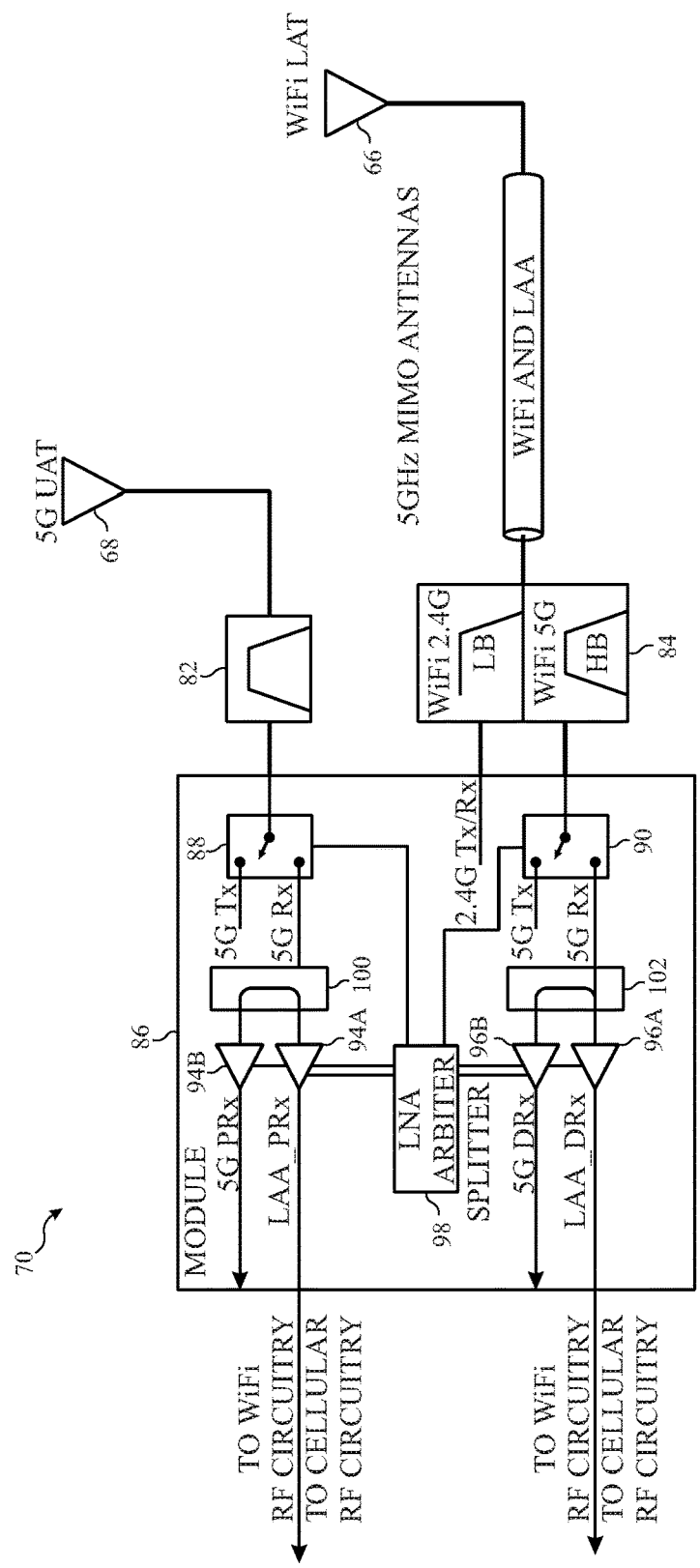
FIG. 8 is a schematic diagram of radio frequency (RF) front end circuitry the included within the transceiver of FIG. 6, in accordance with an embodiment.

Turning now to FIG. 8, a detailed illustration of the RF front end circuitry 70 is depicted. For example, as illustrated, in certain embodiments, the antennas 66 and 68 (e.g., MIMO antennas) may include a dedicated cellular (e.g., 5 GHz Wi-Fi) licensed antenna 66 and a dedicated unlicensed (e.g., 5 GHz LTE-LAA) antenna 68. In certain embodiments, as incoming RF data signals (e.g., Wi-Fi and/or LTE-LAA signals) are detected by the respective antennas 66 and 68, the data signals may be passed through respective filters 82 and 84. For example, data signals detected by the dedicated unlicensed (e.g., LTE-LAA) antenna 68 may be passed, for example, through the filter 82 (e.g., 5 GHz bandpass filter) and through a switch 88 (e.g., $T_x/R_x$ switch) of a front end module (FEM) 86.

Data signals detected by the dedicated cellular (e.g., 5 GHz Wi-Fi) licensed antenna 66 may be passed, for example, through the filters 84 (e.g., 5 GHz high-pass filter and 2.4 GHz low-pass filter) and through a switch 90 (e.g., $T_x/R_x$ switch) of the FEM 86. The switches 88 and 90 may be used to switch between, for example, transmitting and receiving signals (e.g., which may be controlled by a low noise amplifier (LNA) arbiter device 98 as discussed in further detail below). The filter 82 may include a bandpass filter (e.g., 2.4 GHz bandpass filter) provided to allow 2.4 GHz signals (e.g., and restricting other frequencies) to pass from the dedicated unlicensed (e.g., LTE-LAA) antenna 68 to the FEM 86. Similarly, the filters 84 may include a low-pass filter (e.g., 2.4 GHz low-pass filter) and a high-pass filter (e.g., 5 GHz high-pass filter) provided to allow respective 2.4 GHz and 5 GHz signals to pass from the dedicated cellular (e.g., 5 GHz Wi-Fi) licensed antenna 66 to the FEM 86.

In certain embodiments, as further illustrated, the FEM 86 may include low noise amplifiers (LNAs) 94A, 94B, 96A, and 96B and an LNA arbiter device 98. It should be appreciated that the FEM 86 may include any circuitry that may be generally used to process, for example, Wi-Fi data signals as part of the transceiver 28, and, more generally, within the electronic device 10. However, in accordance with the present techniques, the FEM 86 may include the LNAs 94A, 94B, 96A, and 96B, which may be switched between "ON" (e.g., activated) and "OFF" (e.g., deactivated) states based on, for example, a signal received from the LNA arbiter device 98. In certain embodiments, the LNA arbiter device 98 may be used to, for example, arbitrate or distinguish between 5 GHz (e.g., approximately 5.0-5.8 GHz) and 2.4 GHz Wi-Fi incoming data signals and 5 GHz (e.g., approximately 5.0-5.8 GHz) and 2.4 GHz cellular (e.g., LTE-LAA) incoming data signals based on, for example, a received signal strength indication (RSSI) of the incoming signals. The LNA arbiter device 98 may also, in some embodiments, control the switches 88 and 90 to switch between, for example, transmitting and receiving signals.

For example, in certain embodiments, the LNA arbiter device 98 may sample the incoming 2.4 GHz and/or 5 GHz (e.g., approximately 5.1 GHz to 5.8 GHz band signals) data signals, and then the LNA arbiter device 98 may determine whether the incoming data signals are, for example, either Wi-Fi or LTE-LAA data signals. Based on whether the incoming data signals are Wi-Fi or LTE-LAA data signals, the LNA arbiter device 98 may transmit a signal to turn "ON," for example, the LNAs 94A, 94B, 96A, and 96B. The incoming data signal may be then split (e.g., divided) via signal splitters 100 and 102 and transmitted to, for example, the LNAs 94A, 94B, 96A, and 96B, and lastly to the Wi-Fi specific RF circuitry and/or the cellular specific RF circuitry of the transceiver 28. It should further be appreciated that the RF front end circuitry 70 may allow the transceiver 28 to selectively utilize the LTE-LAA unlicensed frequency bands (e.g., 5.1 GHz to 5.8 GHz) when it may be useful to do so in order to increase data throughput and data processing speeds (e.g., when the licensed LTE frequency bands are particularly congested). In other instances, the transceiver 28, and, by extension, the electronic device 10 may process Wi-Fi data signals and LTE cellular signals using the LTE licensed frequency bands.

In this way, the RF front end circuitry 70 may allow the transceiver 28 to utilize the Wi-Fi signal processing circuitry (e.g., 5 GHz signal processing circuitry) to additionally process LTE-LAA wireless signals in order to conserve area, power, and cost of the transceiver 28, and, by extension, the electronic device 10. The RF front end circuitry 70 of the transceiver 28 may also allow the electronic device 10 to be utilized to allow cellular carriers and operators to utilize the 5 GHz unlicensed frequency spectrum to offload congested licensed frequency bands, and thus increase data throughput and data processing speeds. Furthermore, the RF front end circuitry 70 may allow for concurrent reception of both Wi-Fi and LTE-LAA wireless signals (e.g., 5 GHz wireless signals) while simultaneously allowing, for example, the asynchronous functioning of the Wi-Fi and LTE operation of the electronic device 10. In other embodiments, although not illustrated, the transceiver 28 may include a dedicated RF circuitry (e.g., without the LNA arbiter device 98 and splitters 100 and 102) specifically provided to receive, process, and route LTE-LAA wireless signals.

Figure 9:
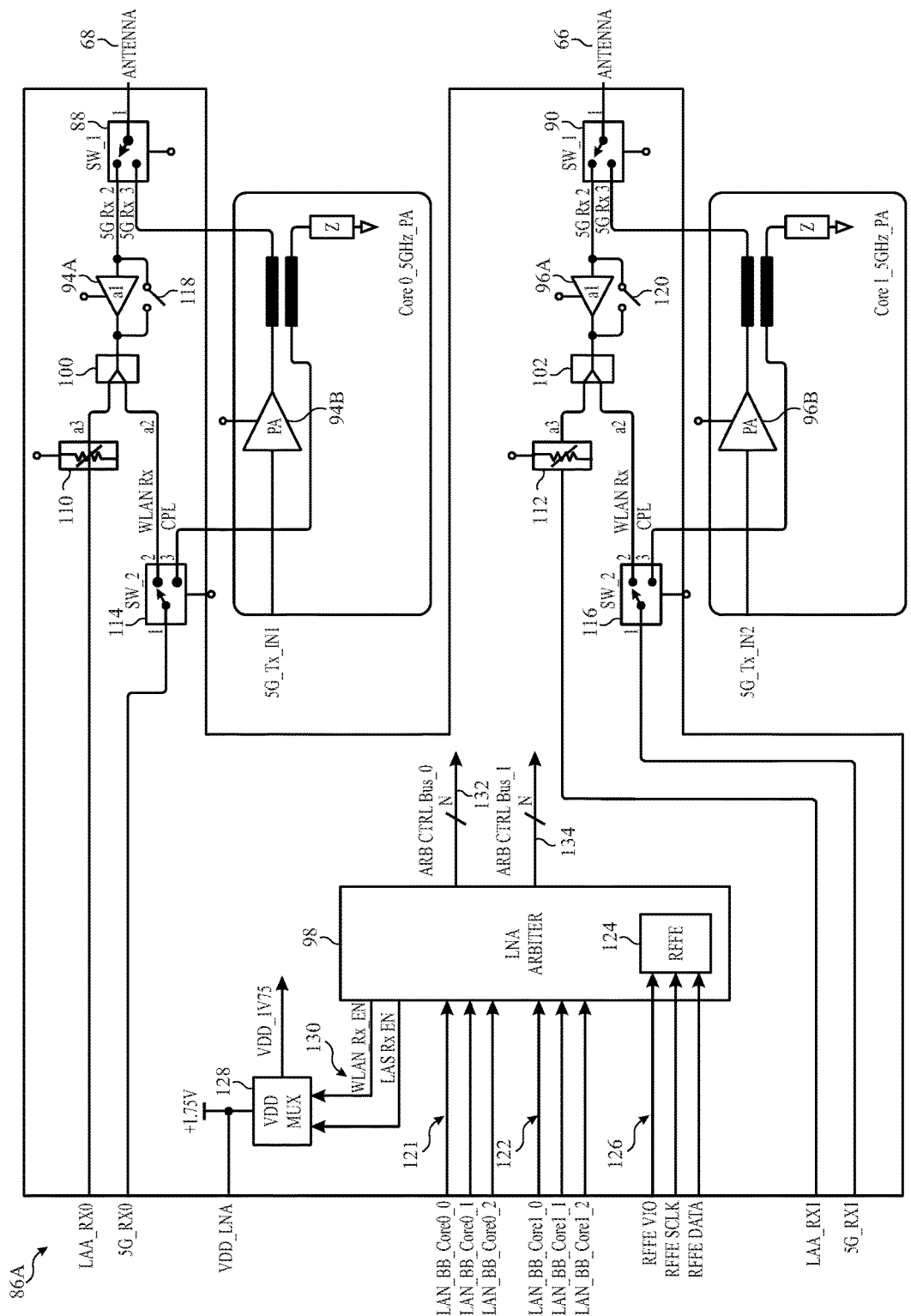
FIG. 9 is a schematic diagram of one embodiment of the front end module (FEM) that may be included as part of the RF front end circuitry in FIG. 8.

Another, more detailed, embodiment of the FEM 86 is illustrated in FIG. 9 as FEM 86A. In addition to the elements previously described with respect to the embodiment illustrated in FIG. 8, the FEM 86A illustrated in FIG. 9 includes gain adjustment devices 110 and 112 in the both the unlicensed and unlicensed paths, respectively. As illustrated, these gain adjustment devices may be variable resistors, but it should be understood any suitable gain adjustment device may be used. In addition, the FEM 86A embodiment of FIG. 9 also includes secondary switches 114 and 116 in the 5G LNA paths for both the unlicensed and licensed paths, respectively. As discussed in further detail below, with additional reference to the table illustrated in FIG. 10, the FEM 86A provides a design that supports 5G/WLAN and LAA simultaneously reception. The LNA arbiter device 98 is responsible for determining the types of signals to be received and/or transmitted via the unlicensed and licensed paths and for controlling the various devices in the FEM 86A accordingly.

Prior to discussing the specific operation of the LNA arbiter device 98, however, it should be noted that the LNAs 94a, 94b, 96a, and 96b, are variable gain amplifiers. Further, it should be noted that LNAs 94a and 96a may be bypassed via the respective bypass switches 118 and 120. Hence, the gain of the signals passing through the unlicensed and licensed paths can be adjusted by adjusting the gains of the LNAs 94a and 96a and the gain adjustment devices 110 and 112 as appropriate. Indeed, the gains provided by the LNAs 94a and 96a can be bypassed entirely by closing the bypass switches 118 and 120, respectively.

To adjust the gains in the unlicensed and licensed paths, the LNA arbiter device 98 receives signals related to the WLAN baseband signals on the unlicensed path on lines 121 and receives signals related to the WLAN baseband signal on the licensed path on line 122. The LNA arbiter device 98 also includes an RF front end (RFFE) 124 that receives signals on lines 126. These various signals indicate the type of signal received and may be used to control a bus interface for control bus 132 and 134 used to control the various devices on the FEM 86A. Based on these input signals, the LNA arbiter device 98 transmits control signals via the control bus 132 to devices in the unlicensed path, such as the first switch 88, the second switch 114, the gain adjustment device 110, the bypass switch 118, and the LNAs 94a and 94b, and the LNA arbiter device 98 transmits control signals via the control bus 134 to devices on the unlicensed path, such as the first switch 90, the second switch 116, the gain adjustment device 112, the bypass switch 120, and the LNAs 96A and 96b. The LNA arbiter device 98 also transmits WLAN receive enable and LNA receive enable signals to a VDD mux 128 via lines 130 to ensure that an appropriate power source is delivered, as set forth in FIG. 10.

The stages A1 and A3 may have independent gain control. The LNAs 94a and 96a and the gain adjustment devices 110 and 112 may each have three gain states: high gain (H), medium gain (M), and low gain (L). The LNAs 94a and 96a may also have a bypass mode (OFF) when the respective bypass switches 118 and 120 are closed. As set forth in FIG. 10, the state of each of the circuit elements illustrated in FIG. 9 is shown in the table 138 for each transmission or reception state 0-13. Generally speaking, the bypass switches 118 and 120 may be closed to minimize gain when an incoming signal is very strong. The remaining gain levels L, M, H for the LNAs 94 and 96 and the gain adjustment devices 110 and 112 are selected based upon the input request (WLAN mode request or LAA mode request) coming from the respective cellular modems. In other words, each modem determines the incoming signal characteristics, e.g., signal strength, and causes the LNA arbiter device 98 to output appropriate signals to adjust the gains of the LNAs 94 and 96 and gain adjustment devices 110 and 112 accordingly, as set forth in FIG. 10.

Figure 11:
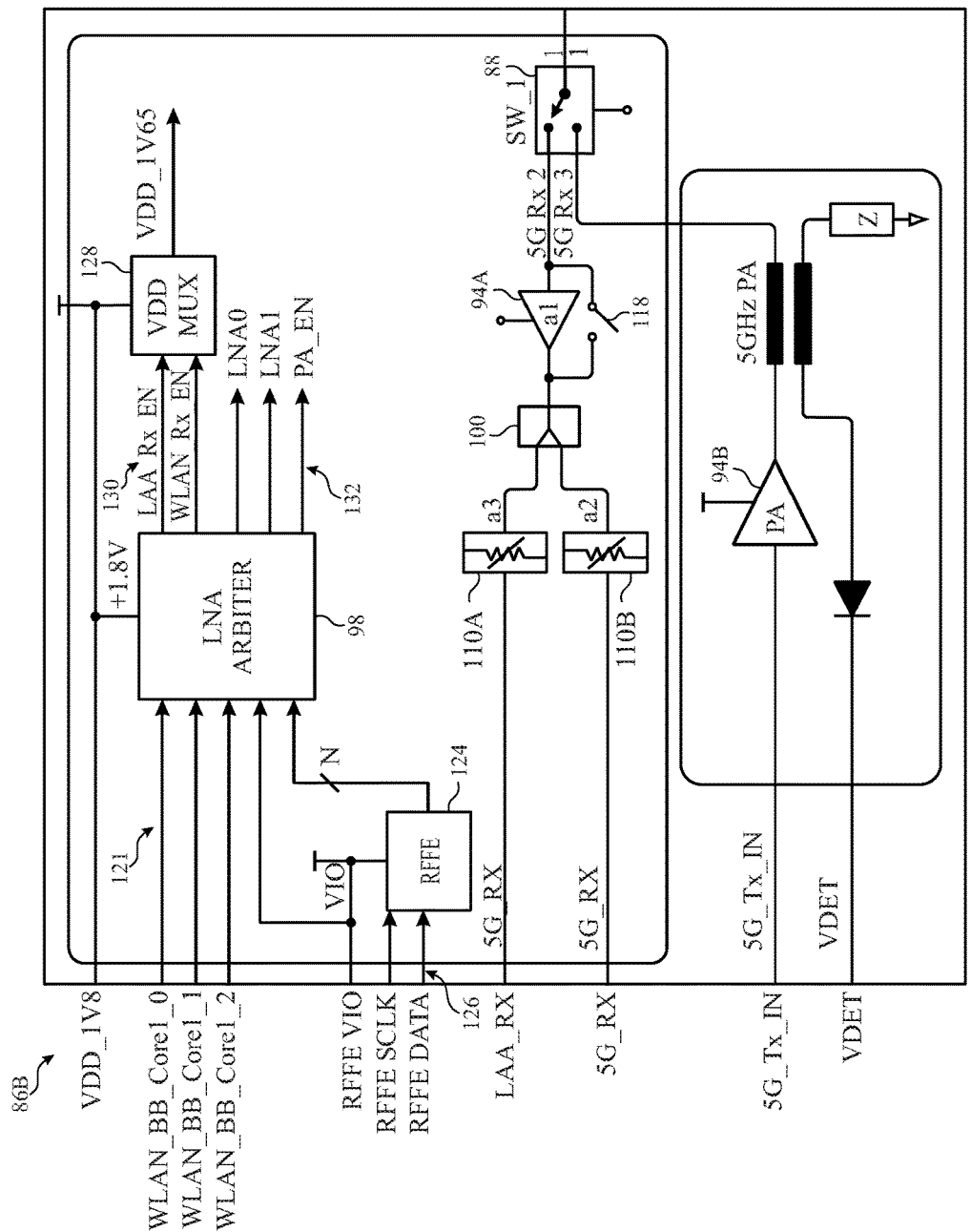
FIG. 11 is a schematic diagram of another embodiment of the front end module (FEM) that may be included as part of the RF front end circuitry in FIG. 8.

Yet another embodiment of the FEM 86 is illustrated in FIG. 11 as FEM 86B. In addition to the elements previously described with respect to the embodiment illustrated in FIG. 9, the FEM 86B illustrated in FIG. 11 includes a respective gain adjustment device 110A and 110B for both the LAA and 5G receive paths, respectively. It should be noted that FIG. 11 illustrates only one core or path, but the LNA arbiter 98 may control two or more paths, similar to those set forth in FIG. 9. As illustrated, these gain adjustment devices 110A and 110B may be variable resistors, but it should be understood any suitable gain adjustment device may be used. In addition, the FEM 86B embodiment of FIG. 11 uses only a single switch 88 and does not include the secondary switches 114 and 116 as set forth in FIG. 9. As discussed in further detail below, with additional reference to the table illustrated in FIG. 12, the FEM 86B provides a design that supports 5G/WLAN and LAA simultaneously reception. The LNA arbiter device 98 is responsible for determining the types of signals to be received and/or transmitted via the unlicensed and licensed paths and for controlling the various devices in the FEM 86B accordingly.

Prior to discussing the specific operation of the LNA arbiter device 98, however, it should be noted that the LNAs 94a and 94b, are variable gain amplifiers. Further, it should be noted that LNA 94a may be bypassed via the bypass switch 118. Hence, the gain of the signals passing through the path can be adjusted by adjusting the gains of the LNAs 94a and 94b and the gain adjustment devices 110A and 110B as appropriate. Indeed, the gains provided by the LNA 94a can be bypassed entirely by closing the bypass switch 118.

To adjust the gains in the paths, the LNA arbiter device 98 receives signals related to the WLAN baseband signals on the path on lines 121. The LNA arbiter device 98 also includes an RF front end (RFFE) 124 that receives signals on lines 126. These various signals indicate the type of signal received and may be used to control a bus interface for control bus 132 used to control the various devices on the FEM 86B. Based on these input signals, the LNA arbiter device 98 transmits control signals via the control bus 132 to devices in the path, such as the switch 88, the gain adjustment devices 110A and 110B, the bypass switch 118, and the LNAs 94a and 94b. The LNA arbiter device 98 also transmits WLAN receive enable and LNA receive enable signals to a VDD mux 128 via lines 130 to ensure that an appropriate power source is delivered, as set forth in FIG. 10.

The stages A1 and A3 may have independent gain control. The LNA 94a and the gain adjustment devices 110A and 110B may each have three gain states: high gain (H), medium gain (M), and low gain (L). The LNA 94a may also have a bypass mode (OFF) when the bypass switch 118 is closed. As set forth in FIG. 12, the state of each of the circuit elements illustrated in FIG. 11 is shown in the table 142 for each transmission or reception state 0-21. Generally speaking, the bypass switch 118 may be closed to minimize gain when an incoming signal is very strong. The remaining gain levels L, M, H for the LNA 94a and the gain adjustment devices 110A and 110B are selected based upon the input request (WLAN mode request or LAA mode request) coming from the respective cellular modems. In other words, each modem determines the incoming signal characteristics, e.g., signal strength, and causes the LNA arbiter device 98 to output appropriate signals to adjust the gains of the LNA 94a and gain adjustment devices 110A and 110B accordingly, as set forth in FIG. 12.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
   a network interface configured to allow the electronic device to communicate over one or more channels of a wireless network;
   a transceiver operably coupled to the network interface and configured to transmit data and to receive data over the one or more channels; and
   a front end module (FEM) operably coupled to the transceiver and configured to receive licensed cellular signals and unlicensed cellular signals over the one or more channels, the FEM having an arbiter device configured to receive information related to the licensed cellular signals and the unlicensed cellular signals and to control at least one variable-gain amplifier and at least one gain adjustment device to independently amplify the licensed cellular signals and the unlicensed cellular signals.

2. The electronic device of claim 1, wherein the arbiter device is configured to provide respective low, medium and high gain control signals to the at least one variable-gain amplifier and the at least one gain adjustment device.

3. The electronic device of claim 1, wherein the FEM comprises a first path for the licensed cellular signals and a second path for the unlicensed cellular signals, and wherein the first path comprises a first variable-gain amplifier operably coupled to a first gain adjustment device, the first variable-gain amplifier configured to receive the licensed cellular signals and to provide amplified licensed cellular signals to the first gain adjustment device, and wherein the second path comprises a second variable-gain amplifier operably coupled to a second gain adjustment device, the second variable-gain amplifier configured to receive the unlicensed cellular signals and to provide amplified unlicensed cellular signals to the second gain adjustment device.

4. The electronic device of claim 1, wherein the FEM is configured to receive and route Long Term Evolution (LTE) signals and Wireless Fidelity (Wi-Fi) signals concurrently.

5. The electronic device of claim 1, wherein the FEM is configured to transmit the data and to receive the data via one or more multiple input multiple output (MIMO) antennas of the network interface.

6. The electronic device of claim 1, wherein the FEM is configured to receive Long Term Evolution License Assisted Access (LTE-LAA) signals as the unlicensed cellular signals.

7. The electronic device of claim 1, wherein the arbiter device is configured to control at least one variable-gain amplifier and at least one gain adjustment device according to the Table 138 set forth in FIG. 10.

8. The electronic device of claim 1, wherein the arbiter device is configured to control at least one variable-gain amplifier and at least one gain adjustment device according to the Table 142 set forth in FIG. 12.

9. An electronic device, comprising:
   a network interface configured to allow the electronic device to communicate over one or more channels of a wireless network;
   a transceiver operably coupled to the network interface and configured to transmit data and to receive data over the one or more channels; and
   a front end module (FEM) operably coupled to the transceiver and configured to receive Long Term Evolution License Assisted Access (LTE-LAA) signals and Wireless Fidelity (Wi-Fi) signals over the one or more channels, the FEM having an arbiter device configured to receive information related to the LTE-LAA signals and the Wi-Fi signals and to control at least one variable-gain amplifier and at least one gain adjustment device to amplify the LTE-LAA signals and the Wi-Fi signals.

10. The electronic device of claim 9, wherein the arbiter device is configured to provide respective low, medium and high gain control signals to the at least one variable-gain amplifier and the at least one gain adjustment device.

11. The electronic device of claim 9, wherein the FEM comprises a first path having a first variable-gain amplifier operably coupled to a signal splitter, the first variable-gain amplifier configured to receive the LTE-LAA signals and the Wi-Fi signals and to provide the received signals to the signal splitter, wherein the signal splitter has a first output operably coupled to a first gain adjustment device and a second output operably coupled to a second gain adjustment device, the first output configured to deliver the LTE-LAA signals to the first gain adjustment device and the second output configured to deliver the Wi-Fi signals to the second gain adjustment device.

12. The electronic device of claim 11, wherein the arbiter device is configured to control at least one variable-gain amplifier and at least one gain adjustment device according to the Table 142 set forth in FIG. 12.

13. The electronic device of claim 9, wherein the FEM comprises a first path having a first variable-gain amplifier operably coupled to a signal splitter, the first variable-gain amplifier configured to receive the LTE-LAA signals and the Wi-Fi signals and to provide the received signals to the signal splitter, wherein the signal splitter has a first output operably coupled to a first gain adjustment device and a second output, the first output configured to deliver the LTE-LAA signals to the first gain adjustment device and the second output configured to deliver the Wi-Fi signals.

14. The electronic device of claim 13, wherein the arbiter device is configured to control at least one variable-gain amplifier and at least one gain adjustment device according to the Table 138 set forth in FIG. 10.

15. The electronic device of claim 9, wherein the FEM is configured to transmit the data and to receive the data via one or more multiple input multiple output (MIMO) antennas of the network interface.

16. A method comprising:
   receiving, via an electronic device, a Wireless Fidelity (Wi-Fi) signal and an unlicensed cellular signal;
   determining characteristics of the Wi-Fi signal and the unlicensed cellular signal; and
   independently amplifying the Wi-Fi signal and the unlicensed cellular signal based at least in part on the characteristics, wherein independently amplifying the Wi-Fi signal and the unlicensed cellular signal comprises using a first variable gain amplifier to amplify the Wi-Fi signal and using a second variable gain amplifier to amplify the unlicensed cellular signal.

17. The method of claim 16, wherein the unlicensed cellular signal comprises a Long Term Evolution License Assisted Access (LTE-LAA) signal.

18. The method of claim 16, wherein the Wi-Fi signal and the unlicensed cellular signal are received and independently amplified concurrently.

19. The method of claim 16, wherein independently amplifying the Wi-Fi signal and the unlicensed cellular signal comprises using a first gain adjustment device to amplify the Wi-Fi signal and using a second gain adjustment device to amplify the unlicensed cellular signal.

\* \* \* \* \*